United States Patent
Lee et al.

(10) Patent No.: US 7,638,387 B2
(45) Date of Patent: Dec. 29, 2009

(54) MASK ROM AND METHOD OF FABRICATING THE SAME

(75) Inventors: Yong-Kyu Lee, Gwacheon-si (KR); Hee-Seog Jeon, Suwon-si (KR); Jeong-Uk Han, Suwon-si (KR); Young-Ho Kim, Hwaseong-si (KR); Myung-Jo Chun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 346 days.

(21) Appl. No.: 11/823,381

(22) Filed: Jun. 27, 2007

(65) Prior Publication Data

US 2008/0003810 A1    Jan. 3, 2008

(30) Foreign Application Priority Data

Jul. 3, 2006    (KR) ........................ 10-2006-0062064

(51) Int. Cl.
*H01L 21/8234* (2006.01)
(52) U.S. Cl. .................. 438/237; 438/328; 438/637; 438/778; 257/390; 257/E21.662; 257/E21.667
(58) Field of Classification Search ................ 438/328, 438/764; 257/244, E21.613, E21.662, E21.667
See application file for complete search history.

(56) References Cited

U.S. PATENT DOCUMENTS 6,731,535 B1 *    5/2004    Ooishi et al. ................ 365/171

2005/0073010 A1    4/2005    Lai et al.
2008/0128853 A1 *    6/2008    Choi et al. ................... 257/530

OTHER PUBLICATIONS

Japanese Patent Publication No. JP6334139 to Masataka et al., having Publication date of Dec. 12, 1994 (w/English Abstract page).
Japanese Patent Application No. JP2004165632 to Shoshi et al., having Publication date of Jun. 10, 2004 (w/English Abstract page).
Korean Patent Application No. 1020030030184 to Shin, having Publication date of Nov. 20, 2004 (w/ English Abstract page).
Japanese Patent Application No. 07-335578 to Nobufumi et al., having Publication date of Sep. 13, 1996 (w/ English Abstract page).
Japanese Patent Application No. 2004-075768 to Koichi, having Publication date of Sep. 29, 2005 (w/ English Abstract page).

* cited by examiner

*Primary Examiner*—Walter L Lindsay, Jr.
*Assistant Examiner*—Cheung Lee
(74) *Attorney, Agent, or Firm*—Monica H. Choi

(57) ABSTRACT

A mask read-only memory (ROM) includes a dielectric layer formed on a substrate and a plurality of first conductive lines formed on the dielectric layer. A plurality of diodes are formed in the first conductive lines, and a plurality of final vias are formed for a first set of the diodes each representing a first type of memory cell, with no final via being formed for a second set of diodes each representing a second type of memory cell. Each of a plurality of second conductive lines is formed over a column of the diodes.

20 Claims, 7 Drawing Sheets

US 7,638,387 B2
MASK ROM AND METHOD OF FABRICATING THE SAME

BACKGROUND OF THE INVENTION

This application claims priority under 35 U.S.C. §119 to Korean Patent Application No. 2006-62064, filed on Jul. 3, 2006 in the Korean Intellectual Property Office, the disclosure of which is incorporated herein in its entirety by reference.

1. Field of the Invention

The present invention relates generally to mask read-only memory (ROM), and more particularly to a mask ROM with coding using final vias formed toward the end of the backend processes.

2. Background of the Invention

Semiconductor memory devices may generally be classified into nonvolatile memory devices which do not lose data even when power is cut off, and volatile memory devices which lose data when power is cut off.

Nonvolatile memory devices may be classified into mask read-only memories (ROMs), which cannot be programmed by a user, and programmable ROMs (PROMs), one-time programmable ROMs (OTPROMs), erasable programmable ROMs (EPROMs), and electrically erasable programmable ROMs (EEPROMs), which all may be programmed by a user.

The mask ROM has data stored therein according to coding represented in a mask as generated by a user. Mask ROMs are classified into NAND-type mask ROMs with coding implemented before fabrication of gate electrodes, and NOR-type mask ROMs with coding implemented after fabrication of gate electrodes.

The NOR-type mask ROM has shorter turn-around time (TAT) than the NAND-type mask ROM because coding for the NOR-type mask ROM is performed after fabrication of the gate electrodes. However, the number of backend processes increases as size of memory chips decreases, functions of memory chips diversify, and performance of memory chips improves, thus increasing TAT.

In the case of a conventional mask ROM having transistors, on/off cells are formed by adjusting a threshold voltage of each transistor. Thus, miniaturizing such a memory chip is difficult. In addition, TAT increases for such a memory chip since the coding is performed before the backend processes begin.

In the case of a conventional mask ROM having typical diodes formed in contacts, miniaturizing such a memory chip is difficult since the size of contacts must be reduced. Doping contacts with decreased size becomes more difficult. In addition, decreasing TAT is difficult since contacts are formed relatively early in the back-end processes.

In the case of a conventional mask ROM having a plurality of diodes formed in wells within a substrate, the diodes are completely formed during front-end processes. Thus, TAT increases with an increase in the number of back-end processes.

SUMMARY OF THE INVENTION

Accordingly, the present invention forms a mask read-only memory (ROM) within coding using final vias formed toward the end of the back-end processes.

A mask read-only memory (ROM) according to an embodiment of the present invention includes a dielectric layer formed on a substrate and a plurality of first conductive lines formed on the dielectric layer. The mask ROM also includes a plurality of diodes formed in the first conductive lines and a plurality of final vias formed for a first set of the diodes each representing a first type of memory cell, with no final via being formed for a second set of diodes each representing a second type of memory cell. The mask ROM further includes a plurality of second conductive lines, each formed over a column of the diodes.

In one embodiment of the present invention, the final vias are formed under a top-most interconnect layer, and the second conductive lines are formed as the top-most interconnect layer.

In a further embodiment of the present invention, the second conductive lines used as bit-lines are formed perpendicular to the first conductive lines used as word lines with each of the diodes being formed at an intersection of the first and second conductive lines.

In another embodiment of the present invention, each final via couples a respective one of the diodes to a respective one of the second conductive lines.

In a further embodiment of the present invention, the dielectric layer covers an integrated circuit formed on the semiconductor substrate.

In another embodiment of the present invention, the first conductive lines are comprised of polysilicon having an n-type dopant, and the diodes are formed by forming p-type regions in the first conductive lines.

In a further embodiment of the present invention, the mask ROM also includes a plurality of contacts, each disposed between a respective one of the diodes and a respective one of the final vias.

In another embodiment of the present invention, the mask ROM further includes a passivation layer disposed on the second conductive lines.

In a further embodiment of the present invention, the mask ROM also includes a plurality of strapping lines, each coupled to a respective one of the first conductive lines.

In this manner, because coding is implemented using final vias formed toward the end of the backend processes, the turn-around-time for manufacturing the mask ROM is easily reduced.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein.

Rather, these embodiments are provided so that this disclosure will be thorough and complete and will fully convey the concept of the invention to those skilled in the art, and the present invention will only be defined by the appended claims. Like reference numerals refer to like elements throughout the specification.

The present invention will be described with reference to perspective views, cross-sectional views, and/or plan views, in which preferred embodiments of the invention are shown. Thus, the profile of an exemplary view may be modified according to manufacturing techniques and/or allowances.

That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Figure 1:
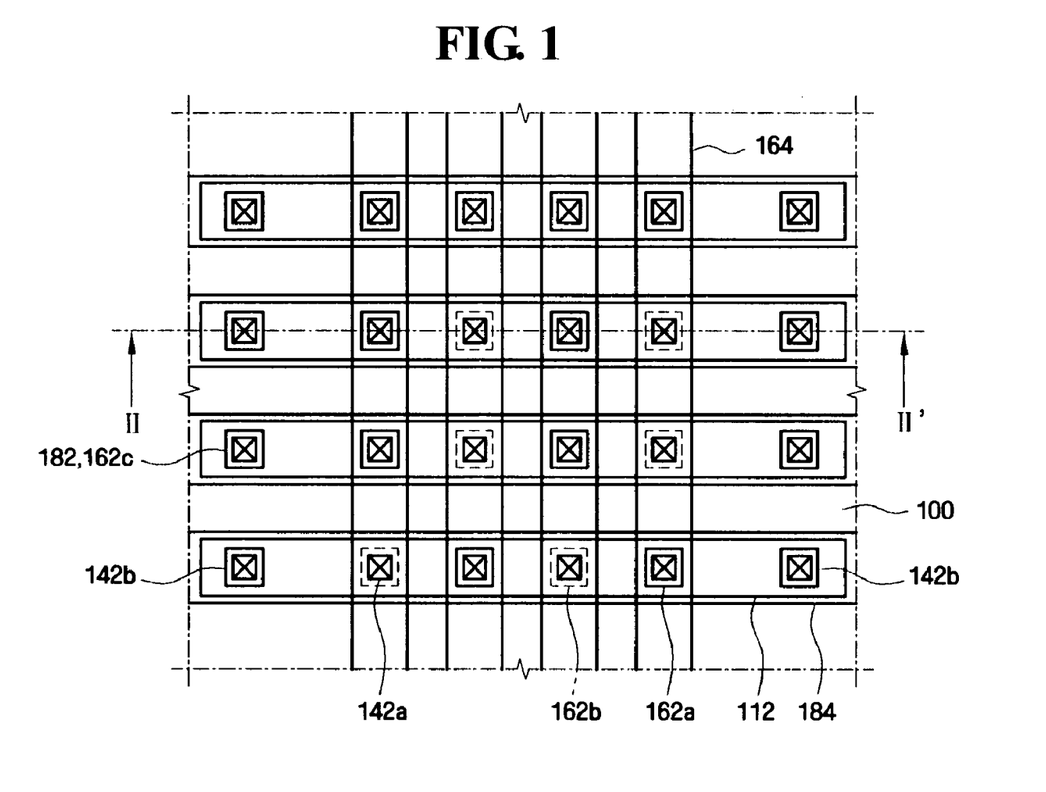
FIG. 1 is a plan view of a mask read-only memory (ROM) according to an embodiment of the present invention.
Figure 2:
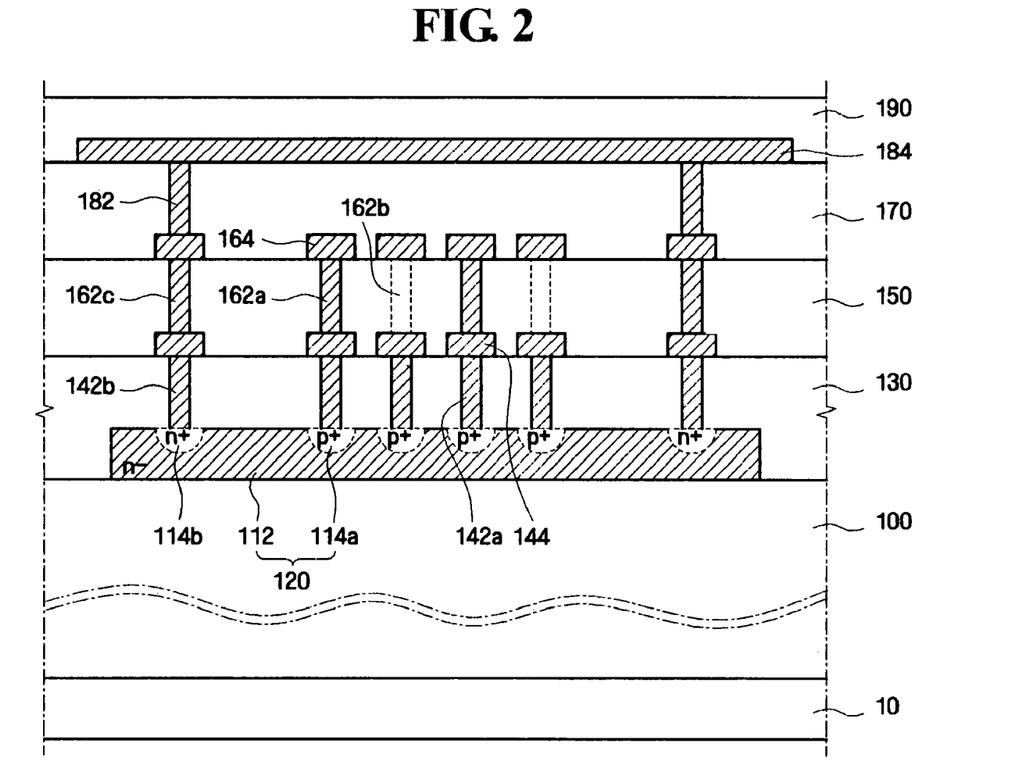
FIG. 2 is a cross-sectional view of the mask ROM along line II-II' of FIG. 1.

FIG. 1 is a plan view of a mask read-only memory (ROM) according to an embodiment of the present invention. FIG. 2 shows a cross-sectional view of the mask ROM along line II-II' of FIG. 1.

Referring to FIGS. 1 and 2, the mask read-only memory (ROM) includes a plurality of semiconductor devices of an integrated circuit (not shown) formed with a semiconductor substrate 10. Such an integrated circuit may be used during operation of the mask ROM. A first dielectric layer 100 is disposed on such semiconductor devices of the integrated circuit. A plurality of on/off memory cells of the mask ROM are disposed on the first dielectric layer 100.

For forming such memory cells, a plurality of first conductive lines 112 which form word-lines of the mask ROM are disposed on the first dielectric layer 100. The word-lines 112 are doped with impurities of a first conductivity type such as n-type for example. In addition, a plurality of impurity regions 114a that are doped with impurities of a second conductivity type such a p-type are formed in the word-lines 112. Each of such impurity regions 114a forms an anode of a respective diode 120 on the first dielectric layer 100.

Furthermore, a plurality of second conductive lines 164 which form bit-lines of the mask ROM are formed perpendicular to the word-lines 112. Each of the impurity regions 114a is disposed at a respective intersection between a respective one of the word-lines 112 and a respective one of the bit-lines 164. The word-lines 112 are comprised of polysilicon doped with impurities of the first conductivity type, or are comprised of recrystallized polysilicon for reduced resistance, according to an example embodiment of the present invention.

The first dielectric layer 100 disposed under the plurality of diodes 120 is comprised of silicon oxide such as borosilicate glass (BSG), phosphosilicate glass (PSG), borophosphosilicate glass (BPSG), tetraethylorthosilicate (TEOS) material, $O_3$-TEOS, or plasma enhanced tetraethylorthosilicate (PE-TEOS) material, according to an example embodiment of the present invention.

By forming the diodes 120 on the first dielectric layer 100, the resolution of the word-lines 112 may be enhanced. In addition, the diodes 120 are not adversely affected from the former fabrication processes for forming underlying layers such as wells of the first and second conductivity-type formed in the semiconductor substrate 10.

A second dielectric layer 130 is disposed on the word-lines 112 including the impurity regions 114a. A plurality of contacts 142a are formed in the second dielectric layer 130, with each of the contacts 142a being connected to a respective one of the impurity regions 114a.

A plurality of pads 144 is disposed on the surface of the second dielectric layer 130 with each of the pads 144 being connected to a respective one of the contacts 142a. The pads 144 increase the electrical contact areas of the contacts 142a. The present invention may be practiced with or without the pads 144.

A third dielectric layer 150 is disposed on the second dielectric layer 130 on which the pads 144 are formed. A plurality of final vias 162a used for coding in the mask ROM are formed in the third dielectric layer 150.

The final vias 162a are selectively formed with each of the final vias 162a being connected to a respective one of the contacts 142a corresponding to a first set of diodes representing on-memory cells (i.e., first type of memory cells) of the mask ROM. Diodes having no final vias (i.e., non-final vias 162b in FIG. 2) correspond to a second set of diodes representing off-memory cells (i.e., second type of memory cells) of the mask ROM.

The formation of the final vias 162a is determined from a coding mask provided by a user. Such a coding mask is used during patterning of the openings for forming the final vias 162a and thus determines the locations of where the final vias 162a are formed and where a final via is not formed.

Additional dielectric layers may be interposed between the second dielectric layer 130 and the third dielectric layer 150. In that case, other layers of vias would be formed through such additional dielectric layers between the contacts 142a and the final vias 162a.

According to one example embodiment of the present invention, the final vias 162a are formed under a top-most interconnect layer such that the final vias 162a are formed toward the end of the backend processes. In that case, the bit-lines 164 are formed as part of the top-most interconnect layer. The term "top-most interconnect layer" refers to the interconnect layer farthest from the semiconductor substrate 10.

Generally, backend processes refer to the processes for forming interconnect toward the end of fabricating an integrated circuit. However, the present invention may be practiced generally with the final vias being formed as any via layer for connecting interconnect lines formed on different dielectric layers.

The bit-lines 164 are disposed on the third dielectric layer 150 in which the final vias 162a are formed. The bit-lines 164 are disposed to be perpendicular with respect to the word-lines 112 and are disposed above the final vias 162a. Thus, each bit-line 164 is disposed above a column of the diodes 120, and each of the diodes 120 is formed at a respective intersection between a respective one of the word-lines 112 and a respective one of the bit-lines 164.

A fourth dielectric layer 170 is disposed on the bit-lines 164 according to an example embodiment of the present invention. In that case, a plurality of strapping lines 184 is disposed on the fourth dielectric layer 170. Each strapping line is coupled to a respective one of the word-lines 112 via a plurality of contacts 142b, 162c, and 182 at ends of the word-line 112 for reducing the resistance of such a word-line 112. A passivation layer 190 is disposed on the strapping lines 184.

The present invention may be practiced with or without the strapping lines 184. Alternatively, the strapping lines 184 may be disposed under the bit-lines 164 in the case that the bit-lines 164 form the topmost interconnect layer of the mask ROM. In that case, the fourth dielectric layer 170 that covers the bit-lines 164 forms a passivation layer.

In this manner, the final vias 162a formed toward the end of the backend processes are used as coding for determining the on/off memory cells of the mask ROM. Thus, the time from receiving the coding mask from a user to providing the finally fabricated mask ROM to the user (i.e., turn-around-time (TAT)) is easily minimized with the present invention.

A method of fabricating the mask ROM of FIGS. 1 and 2 is now described with reference to the cross-sectional views of FIGS. 3, 4, 5, 6, 7, and 8, according to an embodiment of the present invention.

Figure 3:
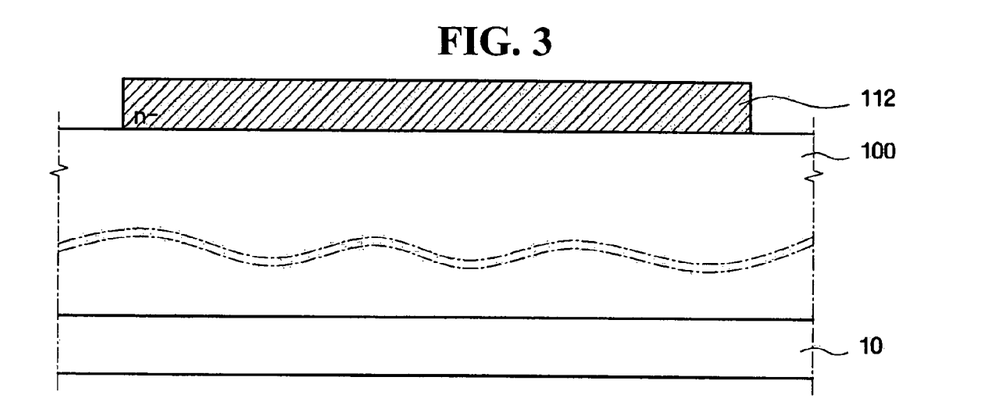
FIGS. 3, 4, 5, 6, 7, and 8 are cross-sectional views illustrating fabrication of the mask ROM of FIGS. 1 and 2 according to an embodiment of the present invention.

Referring to FIG. 3, the first dielectric layer 100 is formed on the semiconductor substrate 10 on which the semiconductor devices of an integrated circuit (not shown) are formed. The first dielectric layer 100 is comprised of a silicon oxide layer such as borosilicate glass (BSG), phosphosilicate glass (PSG), borophosphosilicate glass (BPSG), tetraethylorthosilicate (TEOS) material, an $O_3$-TEOS material, or a plasma enhanced tetraethylorthosilicate (PE-TEOS) material, according to an embodiment of the present invention.

Thereafter, the first conductive lines 112 which form the word-lines of the mask ROM are formed by depositing polysilicon having a dopant of the first conductivity type and patterning the polysilicon. The first conductivity type is n-type such as when the dopant is phosphorous (P), according to an example embodiment of the present invention. Thereafter, for reducing the resistance of the word-lines 112, the word-lines 112 are recrystallized in one embodiment of the present invention. For example, an annealing process is performed for recrystallizing the word-lines 112.

Figure 4A:
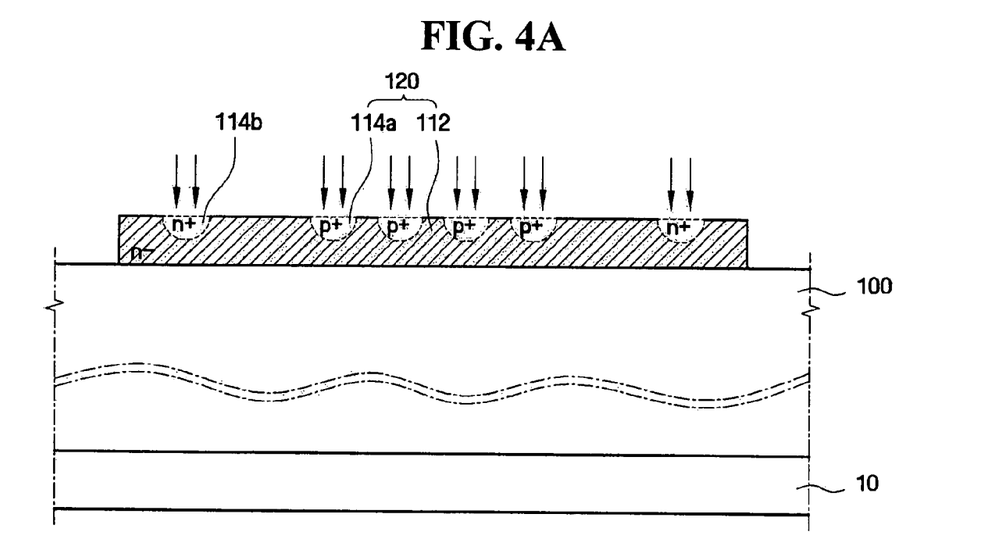

Subsequently, referring to FIG. 4A, an ion implantation mask (not shown) is formed on the word-lines 112, and the impurity regions 114a are formed in predetermined areas of each of the word-lines 112. Each impurity region 114a is formed by doping the surface of a respective one of the word-lines 112 with a dopant of the second conductivity type using the ion implantation mask.

The dopant in the impurity regions 114a is p-type such as boron (B), in one embodiment of the present invention. In detail, the impurity regions 114a are formed according to the desired storage capacity of the mask ROM. For example if the mask ROM is to be comprised of 4-bit cells, four impurity regions 114a may be formed in each of the word-lines 112. Since the impurity regions 114a are formed at intersections between the word-lines 112 and the bit-lines 164 of FIG. 8, the impurity regions 114a are aligned as a matrix on the word-lines 112.

Each of the impurity regions 114a forms a p-n junction of a respective diode that is formed for each memory cell whether an on or off memory cell for the mask ROM. Since the diodes 120 are formed on the first dielectric layer 100, the diodes 120 are not adversely affected by the fabrication processes of the underlying layers.

Figure 8:
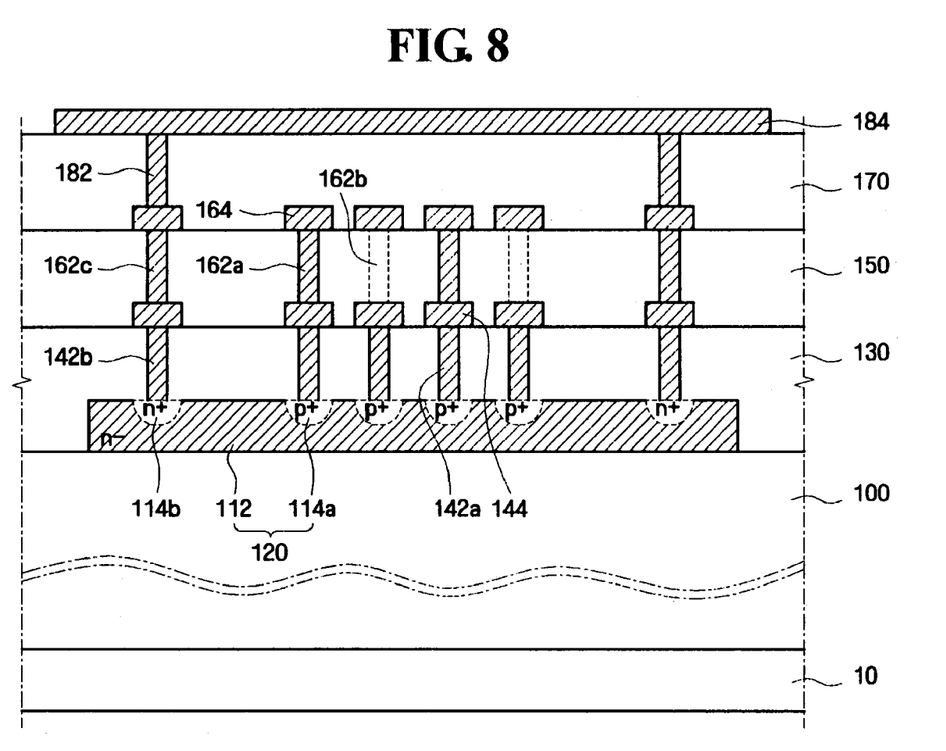

If the strapping line 184 of FIG. 8 is formed, impurity regions 114b are formed at the ends of the word-lines 112 for being connected to the strapping line 184. The impurity regions 114b are doped with a dopant of the first conductivity type of the word-lines 112.

Figure 4B:
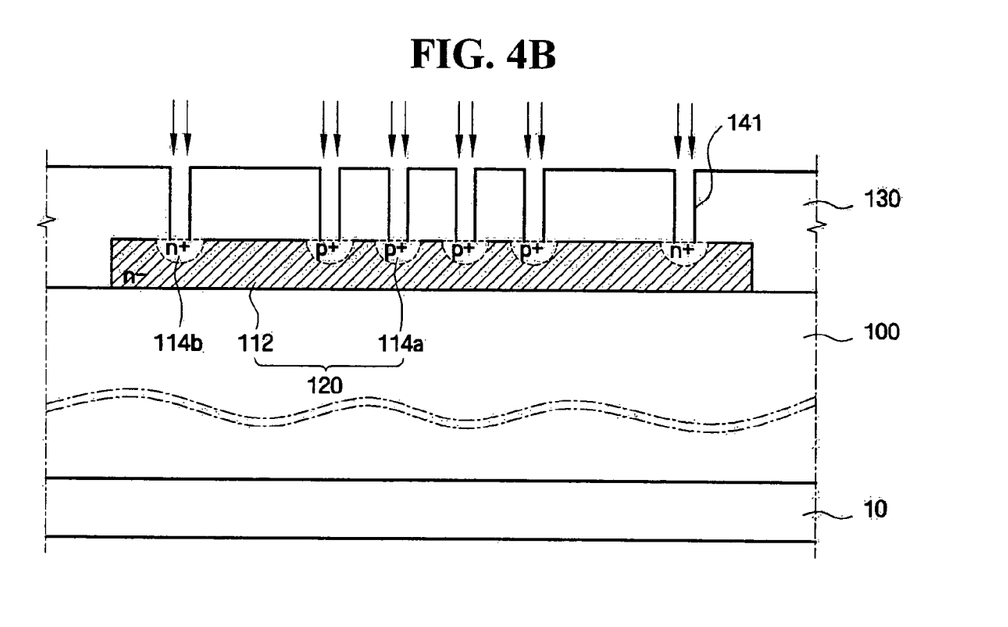

In an alternative embodiment of the present invention, the impurity regions 114a are formed as illustrated in FIG. 4B. Referring to FIG. 4B, a second dielectric layer 130 is formed on the word-lines 112. Thereafter, a mask (not shown) for patterning a plurality of contact holes 141 for an ion implantation step is formed on the second dielectric layer 130. Subsequently, the contact holes 141 are patterned from such a mask.

In that case, the impurity regions 114a are formed by implanting the dopant of the second conductivity type through the contact holes 141 into the surfaces of the word-lines 112. In addition, the impurity regions 114b are formed by implanting the dopant of the first conductivity type through the contact holes 141 into surfaces at the ends of the word-lines 112. With use of such contact holes 141 for implantation as illustrated in FIG. 4B, the impurity regions 114a and 114b are properly self-aligned for effectively scaling down the area of the mask ROM.

Figure 5:
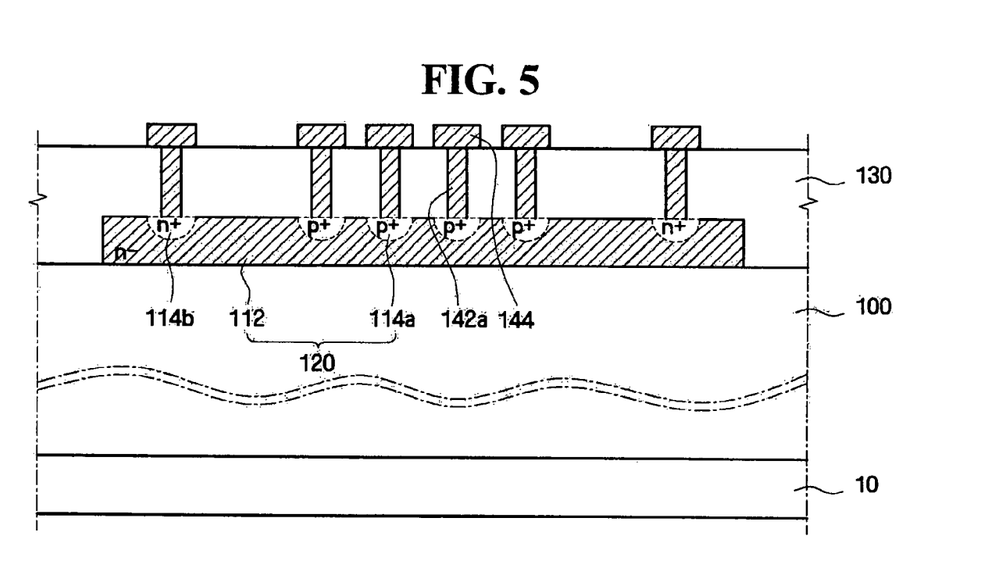

Referring to FIG. 5, after the formation of the diodes 120, the contacts 142a are formed by filling the contact holes 141 with a conductive material. Such a conductive material is aluminium (Al), tungsten (W), or copper (Cu), in one embodiment of the present invention.

Thereafter, the pads 144 are formed using an interconnection layer on the contacts 142a, thereby increasing the electrical contact areas of the contacts 142a. In detail for forming the pads 144, a conductive material is deposited on the second dielectric layer 130, and such conductive material is patterned to form a respective pad 144 over each of the exposed contacts 142a.

Alternatively, the pads 144 may be formed during the formation of the contacts 142a. In detail, the pads 144 are formed along with the contacts 142a during deposition of the conductive material for forming the contacts 142a and the pads 144.

Subsequently referring to FIG. 6, the third dielectric layer 150 is formed to cover the interconnection layer forming the pads 164. At least one additional interlayer dielectric layer may be formed between the second dielectric layer 130 and the third dielectric layer 150. In that case, an additional layer of vias would be formed through such an additional interconnect layer for being connected to the contacts 142a.

Figure 6:
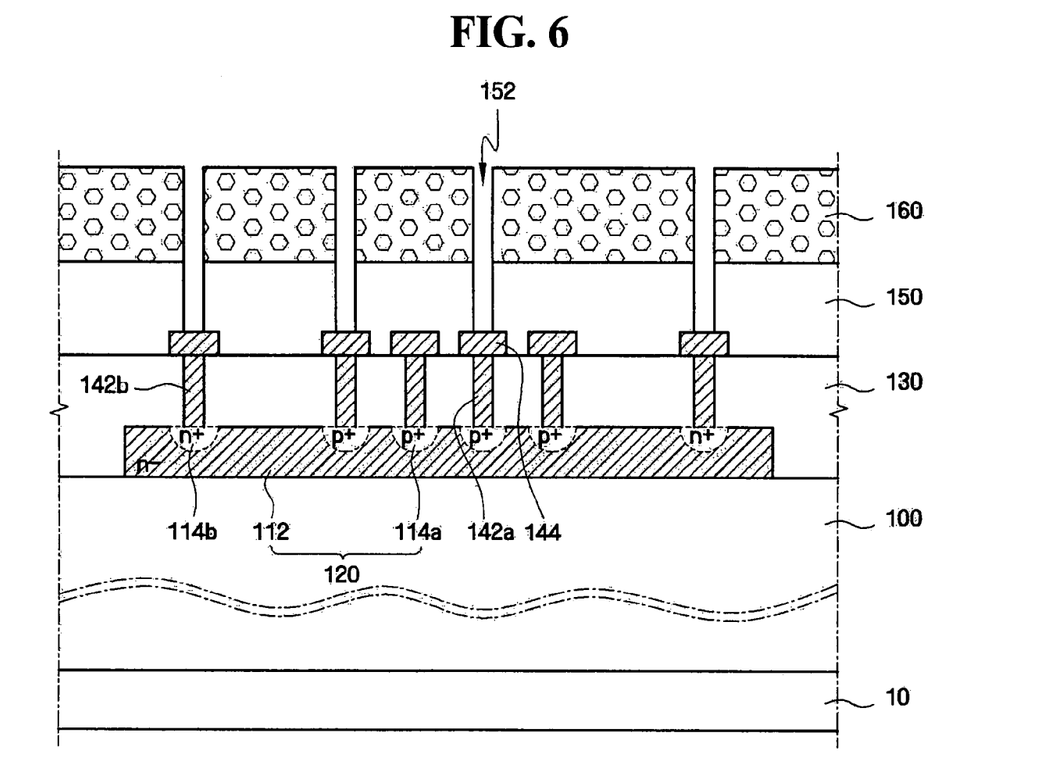

Further referring to FIG. 6, a pattern mask 160 is formed on the third dielectric layer 150 using the coding mask provided by a user. The pattern mask 160 exposes portions of the third dielectric layer 150 for which the first set of memory cells to be deemed the on-memory cells are to be formed. Thereafter, via holes 152 are formed by etching the portions of the third dielectric layer 150 exposed by the pattern mask 160 to expose the respective pads 144. Thereafter, the pattern mask 160 is removed.

Figure 7:
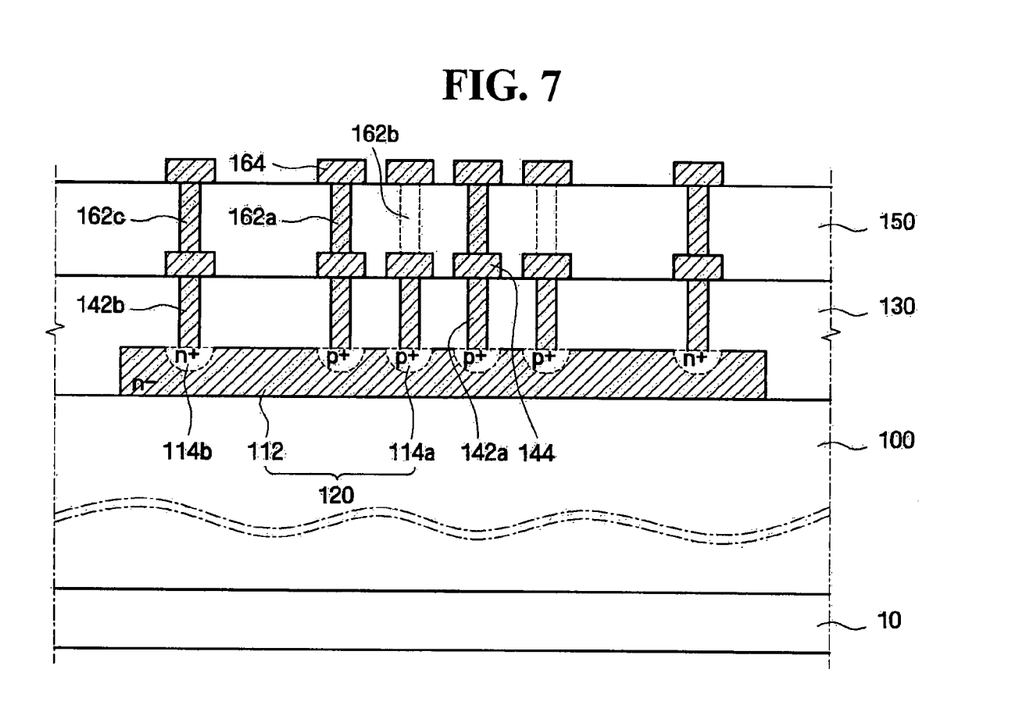

Referring to FIG. 7, the final vias 162a for coding the on-memory cells are formed by depositing a conductive material to fill the via holes 152. The final vias 162a are formed to be connected to the respective contacts 142a and thus the respective diodes 120. According to one example embodiment of the present invention, the final vias 162a are formed under the top-most interconnect layer such that the final vias 162a are formed toward the end of the backend processes. In that case, the bit-lines 164 are form as part of the top-most interconnect layer.

The bit-lines 164 are formed by depositing a conductive material on the third dielectric layer 150 and patterning such conductive material, in one embodiment of the present invention. The bit-lines 164 are formed to be aligned perpendicular to the word-lines 112.

Each bit-line 162 is disposed over a column of the impurity regions 114a. If an impurity region 114a has a respective final via 162a connecting the impurity region 114a to a respective bit-line 162, such an impurity region 114a is for an on-memory cell. Alternatively, if no final via is formed to connect the impurity region 114a to a respective bit-line 162, such an impurity region 114a is for an off-memory cell.

Thus, the on/off memory cells of the mask ROM are determined by whether a final via 162a is present for each memory cell. Because the final vias 162a are formed toward the end of the backend processes, the TAT (turn-around-time) may be easily minimized for fabricating the mask ROM from receiving the coding mask from a user for patterning the finals vias 162*a*.

Subsequently, referring to FIG. 8, the fourth dielectric layer 170 is formed on the bit-lines 164. For reducing the resistance of the word-lines 112, the strapping lines 184 are formed to be comprised of a metal. Each strapping line 184 contacts a respective word-line through respective vias 182 (formed in the fourth dielectric layer 170). Each strapping line 184 is connected to the impurity regions 114*b* formed at the ends of the respective word-line 112. For example, the strapping line 184 is formed by depositing a conductive material on the fourth dielectric layer 170 and patterning the conductive material.

Thereafter, the passivation layer 190 is formed to cover the strapping line 184, thereby completing the formation of the mask ROM of FIGS. 1 and 2. If the strapping lines 184 are not formed, the passivation layer 190 is formed on the bit-lines 164.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A mask read-only memory (ROM) comprising:
   a dielectric layer formed on a substrate;
   a plurality of first conductive lines formed on the dielectric layer;
   a plurality of diodes formed in the first conductive lines;
   a plurality of final vias formed for a first set of the diodes each representing a first type of memory cell, wherein no final via is formed for a second set of diodes each representing a second type of memory cell; and
   a plurality of second conductive lines, each formed over a column of the diodes.

2. The mask ROM of claim 1, wherein the final vias are formed under a top-most interconnect layer.

3. The mask ROM of claim 2, wherein the second conductive lines are formed as the top-most interconnect layer.

4. The mask ROM of claim 1, wherein the second conductive lines used as bit-lines are formed perpendicular to the first conductive lines used as word lines with each of the diodes being formed at an intersection of the first and second conductive lines.

5. The mask ROM of claim 1, wherein each final via couples a respective one of the diodes to a respective one of the second conductive lines.

6. The mask ROM of claim 1, wherein the dielectric layer covers an integrated circuit formed on the semiconductor substrate.

7. The mask ROM of claim 1, wherein the first conductive lines are comprised of polysilicon having an n-type dopant, and wherein the diodes are formed by forming p-type regions in the first conductive lines.

8. The mask ROM of claim 1, further comprising:
   a plurality of contacts, each disposed between a respective one of the diodes and a respective one of the final vias.

9. The mask ROM of claim 1, further comprising:
   a passivation layer disposed on the second conductive lines.

10. The mask ROM of claim 1, further comprising:
    a plurality of strapping lines, each coupled to a respective one of the first conductive lines.

11. A method of fabricating a mask read-only memory (ROM), the method comprising:
    forming a dielectric layer on a substrate;
    forming a plurality of first conductive lines on the dielectric layer;
    forming a plurality of diodes in the first conductive lines;
    forming a plurality of final vias for a first set of the diodes each representing a first type of memory cell, wherein no final via is formed for a second set of diodes each representing a second type of memory cell; and
    forming a plurality of second conductive lines, each formed over a column of the diodes.

12. The method of claim 11, wherein the final vias are formed under a top-most interconnect layer.

13. The method of claim 12, wherein the second conductive lines are formed as the top-most interconnect layer.

14. The method of claim 11, wherein the second conductive lines used as bit-lines are formed perpendicular to the first conductive lines used as word lines with each of the diodes being formed at an intersection of the first and second conductive lines.

15. The method of claim 11, wherein each final via couples a respective one of the diodes to a respective one of the second conductive lines.

16. The method of claim 11, wherein the dielectric layer covers an integrated circuit formed on the semiconductor substrate.

17. The method of claim 11, wherein the first conductive lines are comprised of polysilicon having an n-type dopant, and wherein the diodes are formed by forming p-type regions in the first conductive lines.

18. The method of claim 11, further comprising:
    forming a plurality of contacts, each disposed between a respective one of the diodes and a respective one of the final vias.

19. The method of claim 11, further comprising:
    forming a passivation layer on the second conductive lines.

20. The method of claim 11, further comprising:
    forming a plurality of strapping lines, each coupled to a respective one of the first conductive lines.

* * * * *